US012580015B2

(12) United States Patent
Yang

(10) Patent No.: US 12,580,015 B2
(45) Date of Patent: Mar. 17, 2026

(54) MEMORY DEVICE HAVING ARCHITECTURE OF VOLTAGE DRIVER CIRCUIT AND DECOUPLING CAPACITOR

(71) Applicant: Samsung Electronics Co., Ltd., Suwon-si (KR)

(72) Inventor: Yooseok Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 189 days.

(21) Appl. No.: 18/337,507

(22) Filed: Jun. 20, 2023

(65) Prior Publication Data
US 2024/0170042 A1 May 23, 2024

(30) Foreign Application Priority Data
Nov. 18, 2022 (KR) ......................... 10-2022-0155804

(51) Int. Cl.
*H10B 12/00* (2023.01)
*G11C 11/4074* (2006.01)
*G11C 11/4091* (2006.01)
*G11C 11/4094* (2006.01)

(52) U.S. Cl.
CPC ...... *G11C 11/4074* (2013.01); *G11C 11/4091* (2013.01); *G11C 11/4094* (2013.01)

(58) Field of Classification Search
CPC ............ G11C 11/4047; G11C 11/4091; G11C 11/4094
See application file for complete search history.

(56) References Cited

U.S. PATENT DOCUMENTS

| | | | |
|---|---|---|---|
| 6,392,951 B2 | 5/2002 | Fujima et al. | |
| 6,519,191 B1 | 2/2003 | Morishita | |
| 6,802,043 B2 | 10/2004 | Haga | |
| 7,002,866 B2 | 2/2006 | Hirose et al. | |
| 7,106,649 B2* | 9/2006 | Wada .................. | G11C 11/4087 365/230.06 |
| 7,352,646 B2 | 4/2008 | Choi et al. | |
| 8,072,830 B2 | 12/2011 | Fukuda | |
| 8,599,639 B2 | 12/2013 | Akiyama et al. | |
| 8,699,292 B2 | 4/2014 | Jinbo | |
| 8,830,773 B2 | 9/2014 | Yamagami et al. | |
| 10,685,685 B2 | 6/2020 | Hirose | |
| 2016/0372180 A1* | 12/2016 | Amara ................. | G11C 11/412 |
| 2020/0279589 A1* | 9/2020 | Onuki ................ | G11C 14/0009 |
| 2023/0380142 A1* | 11/2023 | Chen ..................... | H10B 12/33 |
| 2024/0057325 A1* | 2/2024 | Wang .................. | H10B 12/485 |

* cited by examiner

*Primary Examiner* — Min Huang
(74) *Attorney, Agent, or Firm* — Wolf, Greenfield & Sacks, P.C.

(57) ABSTRACT

A memory device having an architecture of a voltage driver circuit and a decoupling capacitor is disclosed. The memory device includes a peripheral circuit structure and a cell array structure vertically overlapping the peripheral circuit structure thereon. The cell array structure includes a memory cell region including a plurality of transistor structures and a plurality of capacitor structures electrically connected to respective ones of the plurality of transistor structures. The peripheral circuit structure includes a first region including sense amplifiers coupled to a plurality of bitlines of the memory cell region and a second region including a first voltage driver circuit that is configured to generate an internal power supply voltage to provide to sense amplifiers.

20 Claims, 10 Drawing Sheets

MEMORY DEVICE HAVING ARCHITECTURE OF VOLTAGE DRIVER CIRCUIT AND DECOUPLING CAPACITOR

CROSS-REFERENCE TO RELATED APPLICATION

This application is based on and claims priority under 35 U.S.C. § 119 to Korean Patent Application No. 10-2022-0155804, filed on Nov. 18, 2022, in the Korean Intellectual Property Office, the disclosure of which is incorporated by reference herein in its entirety.

BACKGROUND

The disclosure relates to a semiconductor device, and more particularly, to a memory device having an architecture of a voltage driver circuit and a decoupling capacitor to reduce the effect of voltage fluctuation.

Recently, as information communication devices have become multifunctional, memory devices are desired to have large capacity and high integration. As the size of memory cells is reduced for high integration, operating circuits and/or wiring structures included in memory devices for operation and electrical connection of the memory devices are becoming more complex. Accordingly, the demand for memory devices having higher integration as well as excellent electrical characteristics has increased. In order to improve the storage capacity and integration of memory devices, vertical channel transistors formed vertically on semiconductor substrates have been developed to replace planar channel transistors formed planarly on semiconductor substrates.

SUMMARY

Provided is a memory device having an architecture of a voltage driver circuit and a decoupling capacitor to reduce the effect of voltage fluctuation related to a plurality of memory cells including vertical channel transistors.

The memory device according to embodiments of the disclosure includes a peripheral circuit structure, and a cell array structure overlapping the peripheral circuit structure, wherein the cell array structure includes a memory cell region including a plurality of wordlines extending in a first horizontal direction and a plurality of bitlines extending in a second horizontal direction that intersects the first horizontal direction, wherein the first horizontal direction and the second horizontal direction intersect the vertical direction, wherein the memory cell region includes a plurality of cell structures including a plurality of transistor structures on the bitlines and capacitor structures electrically connected to respective ones of the transistor structures, and wherein the peripheral circuit structure includes a first region including sense amplifiers coupled to the plurality of bitlines of the memory cell region, and a second region adjacent to the first region and including a first voltage driver circuit configured to generate an internal power supply voltage to provide to the sense amplifiers.

The memory device according to embodiments of the disclosure includes a peripheral circuit structure, and a cell array structure overlapping the peripheral circuit structure, wherein the cell array structure includes a memory cell region including a plurality of wordlines extending in a first horizontal direction and a plurality of bitlines extending in a second horizontal direction that intersects the first horizontal direction, wherein the first horizontal direction and the second horizontal direction intersect the vertical direction, wherein the memory cell region includes a plurality of cell structures including transistor structures on the bitlines and capacitor structures electrically connected to respective ones of the transistor structures, and wherein the peripheral circuit structure includes a first region including sense amplifiers coupled to the bitlines of the memory cell region, and a second region adjacent to the first region and including a first decoupling capacitor electrically connected to an internal power supply voltage line that is configured to provide an internal power supply voltage to the sense amplifiers.

The memory device according to embodiments of the disclosure includes a peripheral circuit structure, and a cell array structure overlapping the peripheral circuit structure, wherein the cell array structure includes a memory cell region including wordlines and bitlines, wherein the memory cell region includes transistor structures on the bitlines and capacitor structures electrically connected to respective ones of the transistor structures respectively, and wherein the peripheral circuit structure includes a first region including sense amplifiers coupled to the plurality of bitlines of the memory cell region and a second region adjacent to the first region and including a voltage generation circuit that is configured to generate an internal power supply voltage and a bitline precharge voltage that are provided to the sense amplifiers.

BRIEF DESCRIPTION OF THE DRAWINGS

Embodiments will be more clearly understood from the following detailed description taken in conjunction with the accompanying drawings in which:

FIGS. 4 and 5 are diagrams of sense amplifiers according to embodiments of the disclosure;

DETAILED DESCRIPTION

A memory device, e.g., dynamic random access memory (DRAM), includes memory cells including vertical channel transistors and capacitors, and operates in a manner in which data is written and read using charges stored in the capacitors. The memory cells are connected to bitlines and complementary bitlines. In a DRAM, when a read operation or a refresh operation is performed, sense amplifiers sense and amplify voltage differences between bitlines and complementary bitlines. Since the sense amplifiers sense the voltage levels of many bitlines at once, the sense amplifiers use an internal power supply voltage capable of supplying a constant current during a sensing operation, rather than an external power supply voltage.

In order to constantly control the sensing operation of sense amplifiers, a voltage driver circuit capable of stably driving an internal power supply voltage is required. In addition, a decoupling capacitor may be needed to reduce the effect of voltage fluctuations since the level of internal power supply voltage may fluctuate due to high-speed sensing switching of sense amplifiers connected to an internal power supply voltage line, which is a major cause of sensing malfunction.

Thus, the efficient arrangement of the voltage driver circuit and the decoupling capacitor in consideration of memory cells including vertical channel transistors may reduce the effect of voltage fluctuations and improve the performance of memory devices.

Figure 1:
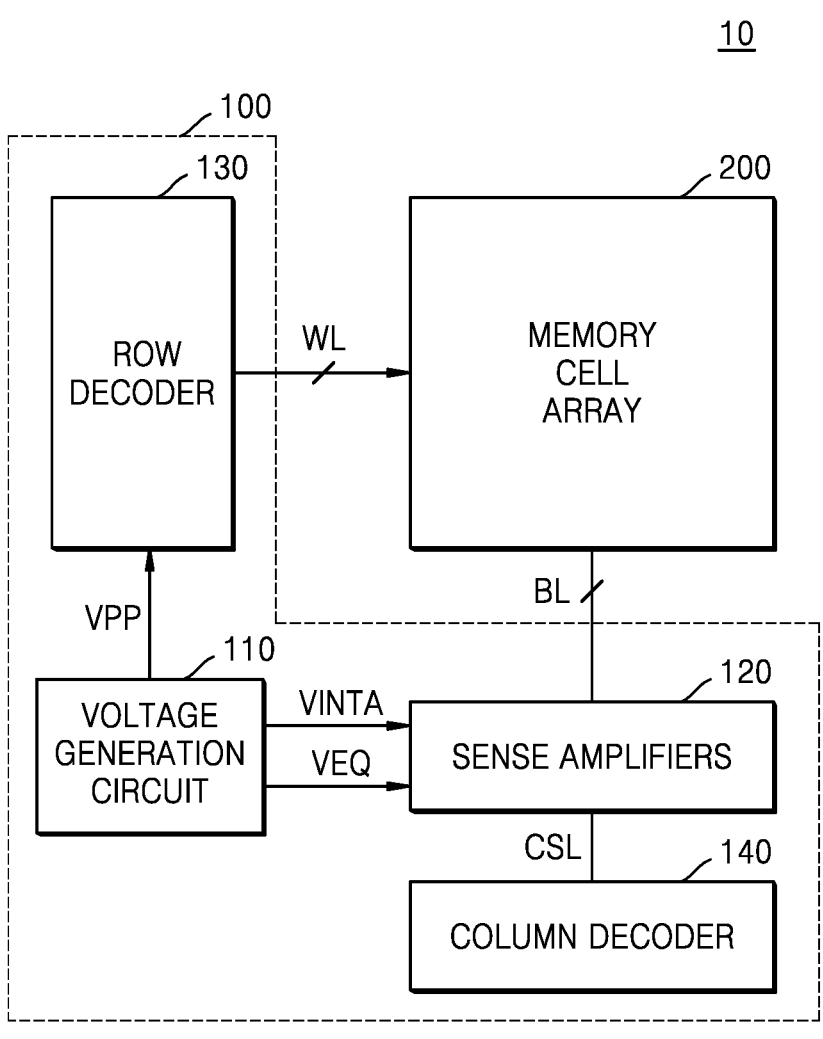
FIGS. 1 and 2 are diagrams of a memory device according to embodiments of the disclosure.
Figure 2:
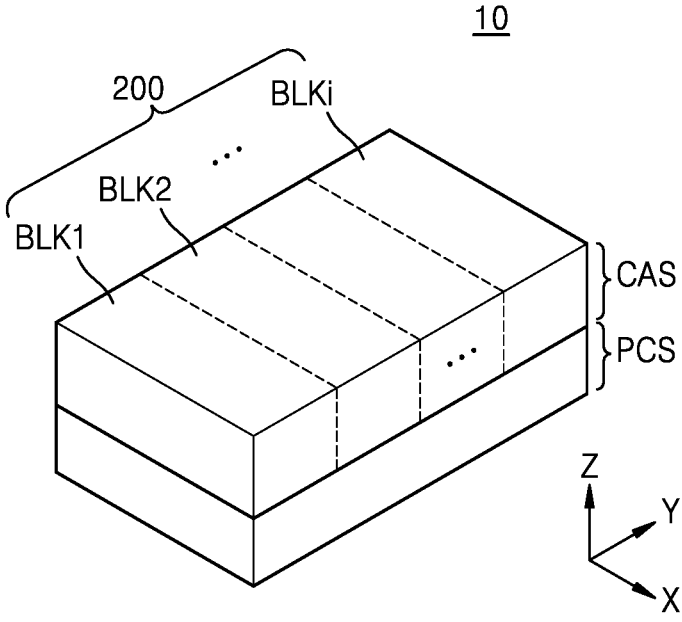

FIGS. 1 and 2 are diagrams of a memory device according to embodiments of the disclosure. FIG. 2 describes a semiconductor structure of the memory device 10 of FIG. 1.

Referring to FIG. 1, the memory device 10 may include a peripheral circuit 100 and a memory cell array 200, wherein the peripheral circuit 100 may include a voltage generation circuit 110, sense amplifiers 120, a row decoder 130, and a column decoder 140. Although not shown, the peripheral circuit 100 may further include a control logic circuit, a data input/output circuit, and a command decoder. In embodiments of the disclosure, the memory device 10 may be DRAM including memory cells including vertical channel transistors and capacitors, and hereinafter, a "memory device" will refer to DRAM.

The memory cell array 200 may be connected to the row decoder 130 through wordlines WL and connected to the sense amplifiers 120 through bitlines BL. In the memory cell array 200, memory cells included in memory blocks BLK1, BLK2, . . . , BLKi in FIG. 2 (where i is a positive integer) may be DRAM memory cells. The memory cell array 200 includes wordlines WL and bitlines BL connected to the memory cells MC in FIG. 4. Each of the memory cells MC may include a cell transistor CT and a cell capacitor CC, wherein the cell transistor CT may be implemented as a cell structure CS described in FIG. 9 and the cell capacitor CC may be implemented as a capacitor structure 990. A gate of the cell transistor CT is connected to one of the wordlines WL. One end of the cell transistor CT is connected to one of the bitlines BL. The cell capacitor CC may store charges of capacity corresponding to single-bit data or multi-bit data.

The voltage generation circuit 110 may generate various internal voltages for driving circuits of the memory device 10. The voltage generation circuit 110 may generate a high voltage VPP, an internal power supply voltage VINTA, a bitline precharge voltage VEQ, a reference voltage, a bulk bias voltage, and the like using the power supply voltage VDD in FIG. 3 applied from the outside of the memory device 10.

Figure 5:
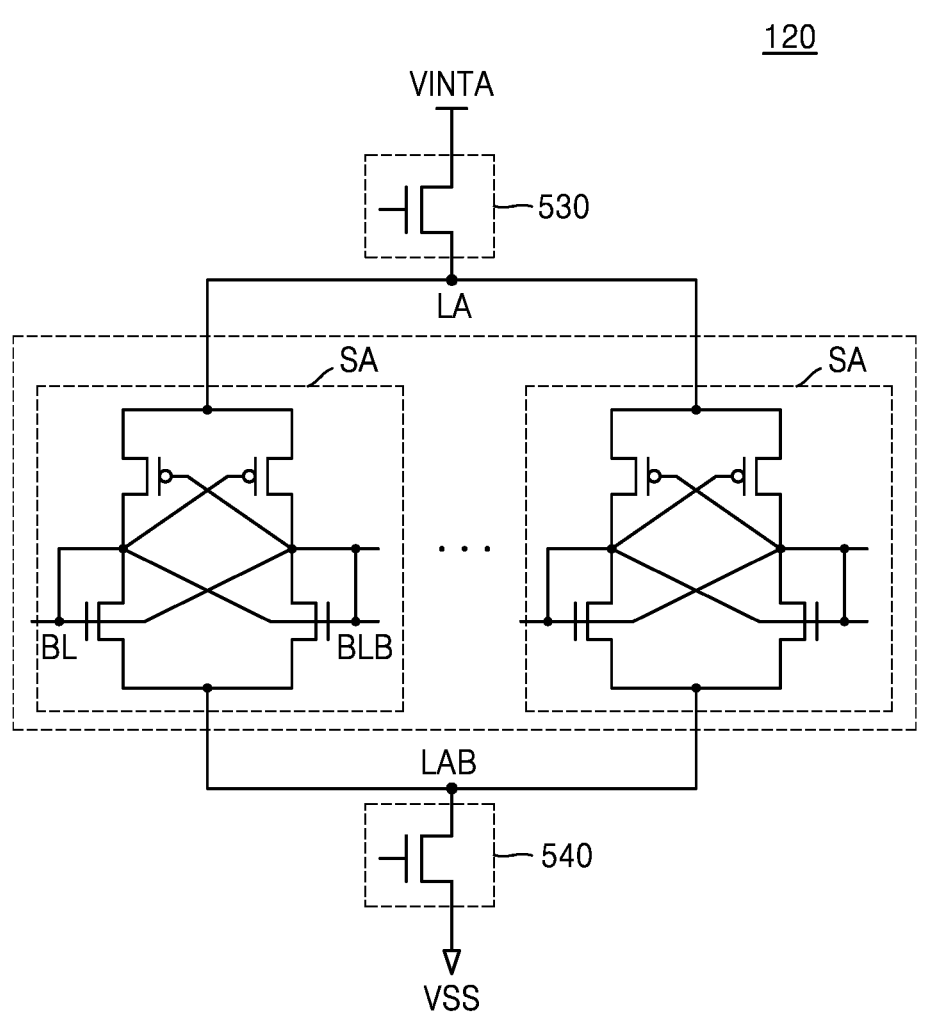
Figure 6:
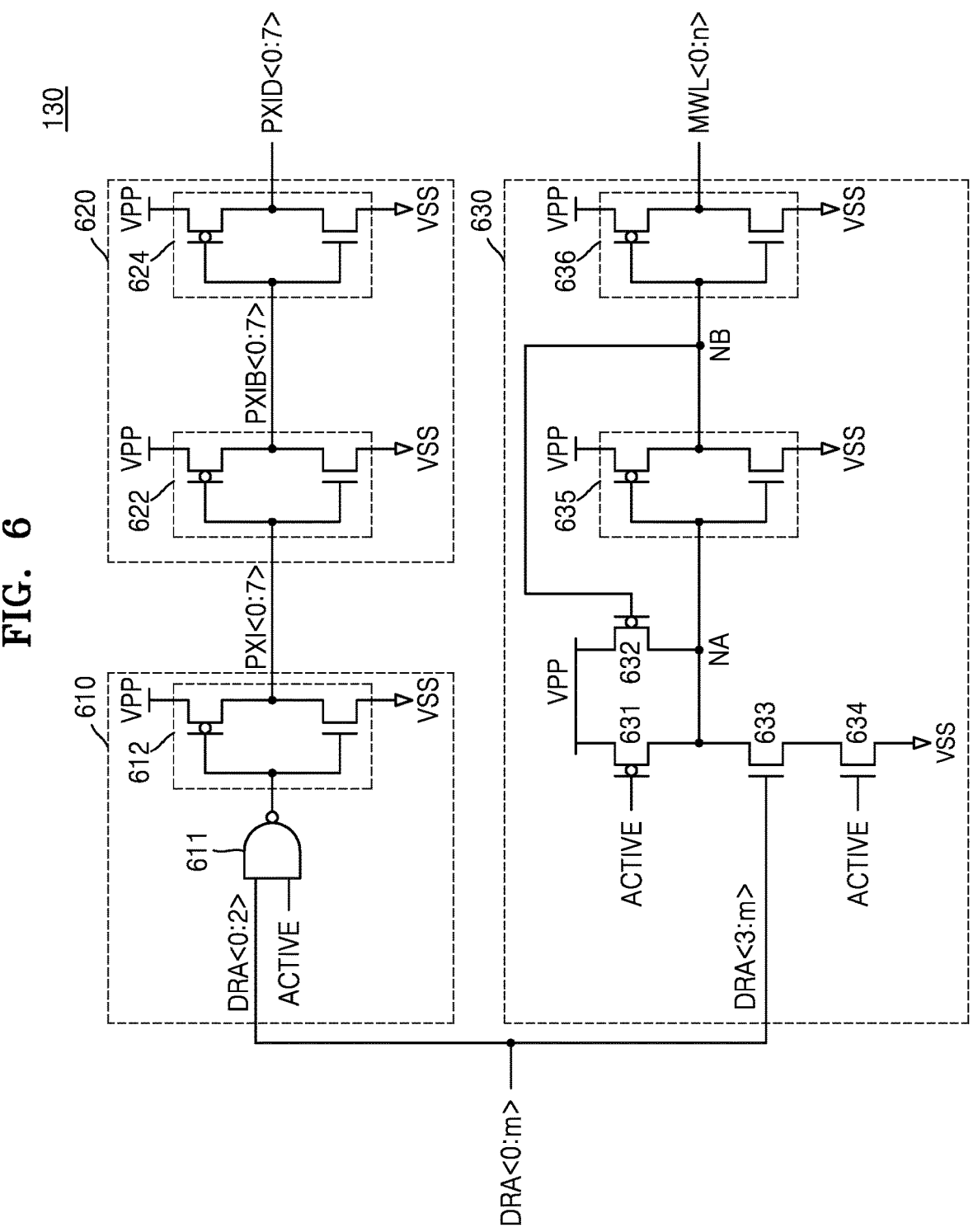
FIG. 6 is a diagram of a row decoder according to embodiments of the disclosure.

For example, the high voltage VPP provided to the row decoder 130 may have a higher voltage level than the power supply voltage VDD, and may be used in a wordline driving circuit in FIG. 6 to turn on the N-type metal oxide semiconductor (NMOS) cell transistor. The bitline precharge voltage VEQ may be used to equalize the bitline BL and the complementary bitline BLB before the sense amplifiers 120 sense the voltage difference between the bitline BL and the complementary bitline BLB. The internal power supply voltage VINTA may be provided to first and second sensing driving voltage lines LA and LAB in FIG. 5 of the sense amplifiers 120. The sense amplifiers 120 may sense and amplify a voltage difference between the bitline BL and the complementary bitline BLB according to the first and second sensing driving voltage lines LA and LAB. The reference voltage may be used to compare against the voltage of the signal received from a command/address bus to determine the logic value of the signal received from a memory controller. The bulk bias voltage, having a negative (−) voltage level lower than the power supply voltage VDD, may be used to increase the data retention time by raising the threshold voltage Vth of the NMOS transistor. The bulk bias voltage, applied to the well region where the NMOS transistor is formed, may be commonly referred to as a back bias voltage.

The sense amplifiers 120 may sense data stored in the memory cells MC and transfer the sensed data to a data input/output circuit to output the sensed data to the outside of the memory device 10 through the data pad(s). The data input/output circuit may receive data to be written in the memory cells MC from the outside and transfer the data to the memory cell array 200. The data input/output circuit may output read data using a data line amplifier that receives and amplifies data sensed by the sense amplifiers 120. The read data may be output to the outside of the memory device 10 through the data pad(s).

The row decoder 130 may decode a row address provided to the memory device 10 to select at least one of the memory blocks BLK1, BLK2, . . . , BLKi, and select wordlines WL of the selected memory block. The row decoder 130 may provide a high voltage VPP for performing a memory operation to the selected wordlines WL.

The column decoder 140 may decode a column address provided to the memory device 10 and provide a column select signal CSL for selecting bitlines BL corresponding to the column address. The bitlines BL selected by the column select signal CSL may be connected to the data input/output circuit.

Referring to FIG. 2, the memory device 10 may include a cell array structure CAS and a peripheral circuit structure PCS overlapping each other in a vertical direction (Z direction). The cell array structure CAS may include the memory cell array 200 of FIG. 1. The peripheral circuit structure PCS may include the peripheral circuit 100 of FIG. 1.

The cell array structure CAS may include memory blocks BLK1, BLK2, . . . , BLKi (where i is a positive integer). The memory blocks BLK1, BLK2, . . . , BLKi may include memory cells including vertical channel transistors and capacitors. The cell array structure CAS and the peripheral circuit structure PCS will be described in detail with reference to FIGS. 8 and 9.

Figure 3:
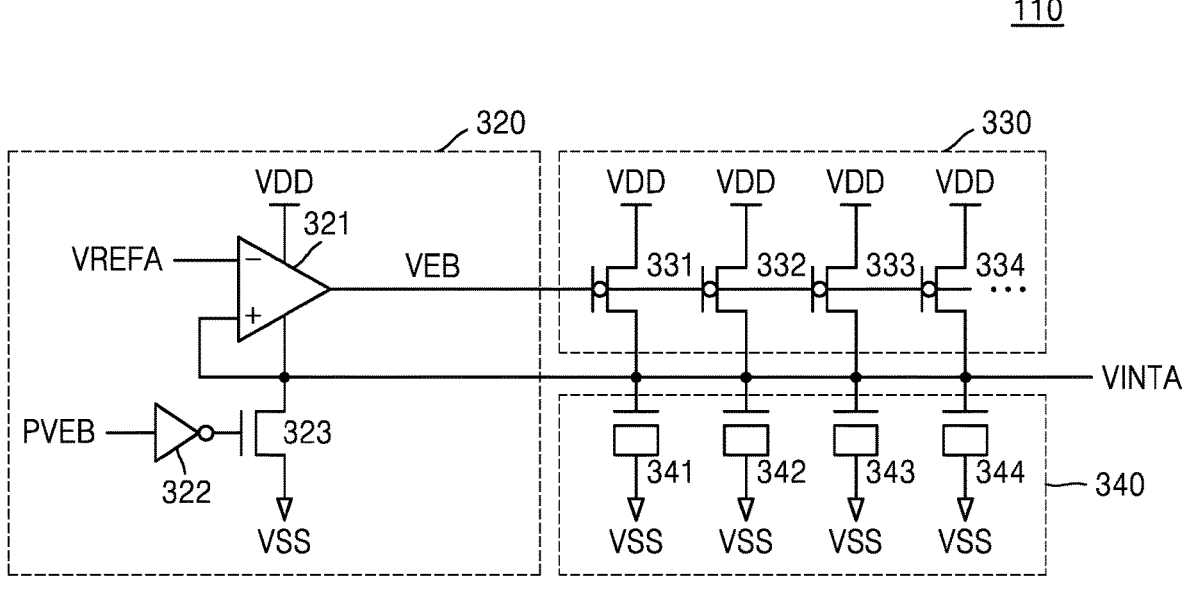
FIG. 3 is a diagram of a voltage generation circuit according to embodiments of the disclosure.

FIG. 3 is a diagram of a voltage generation circuit 110 according to embodiments of the disclosure.

Referring to FIGS. 1 and 3, the voltage generation circuit 110 may generate the internal power supply voltage VINTA from the power supply voltage VDD supplied to the memory device 10 in response to a control signal PVEB. The control signal PVEB may be provided from the control logic circuit based on a command provided to the memory device 10. Hereinafter, the power supply voltage VDD may be used interchangeably with an external power supply voltage VDD.

The voltage generation circuit 110 may include a driving control circuit 320, a voltage driver circuit 330 and a decoupling capacitor 340.

The driving control circuit 320 may include a comparator 321, an inverter 322, and a transistor 323. In the comparator 321 driven by an external power supply voltage VDD and a ground voltage VSS, a reference voltage VREFA line may be connected to an inverting input terminal (−), and an internal power supply voltage VINTA line may be connected to a non-inverting input terminal (+). The comparator 321 may compare the level of the reference voltage VREFA and the level of the internal power supply voltage VINTA, and output a driving control signal VEB as a result of the comparison. The comparator 321 may be enabled when connected to the ground voltage VSS line through the transistor 323. The transistor 323 may be an NMOS transistor. The inverter 322 may receive the control signal PVEB and provide an output thereof to a gate of the transistor 323. The control signal PVEB may be activated at a logic low level when the memory device 10 is in an active mode and deactivated at a logic high level when the memory device 10 is in a standby mode.

The voltage driver circuit 330 may include driving transistors 331 to 334 connected between external power supply voltage VDD lines and an internal power supply voltage VINTA line. The driving transistors 331 to 334 may be P-type metal oxide semiconductor (PMOS) transistors. The driving control signal VEB output from the driving control circuit 320 may be connected to gates of the driving transistors 331 to 334.

In the voltage generation circuit 110, when the memory device 10 is in an active mode, the transistor 323 may be turned on and the comparator 321 may be enabled by the control signal PVEB at a logic low level. The comparator 321 may compare the reference voltage VREFA with the internal power supply voltage VINTA to output the driving control signal VEB, and the driving transistors 331 to 334 may generate the internal power supply voltage VINTA from the external power supply voltage VDD based on the voltage level of the driving control signal VEB.

For example, the comparator 321 may output the driving control signal VEB having a relatively low voltage level when the level of the internal power supply voltage VINTA is lower than the level of the reference voltage VREFA. As the driving transistors 331 to 334 are turned on by the driving control signal VEB having a relatively low voltage level and a current is supplied to the internal power supply voltage VINTA line through the turned-on driving transistors 331 to 334, the level of the internal power supply voltage VINTA may rise. Conversely, when the level of the internal power supply voltage VINTA is higher than the level of the reference voltage VREFA, the comparator 321 may output the driving control signal VEB having a relatively high voltage level and the driving transistors 331 to 334 may be turned off.

When the memory device 10 is in an active mode, the voltage generation circuit 110 may supply a constant current during the sensing operation of the sense amplifiers 120 by outputting the internal power supply voltage VINTA having the same voltage level as the reference voltage VREFA through repeated turn-on and turn-off operations of the driving transistors 331 to 334.

When the memory device 10 is in a standby mode, the voltage generation circuit 110 may output the driving control signal VEB at the level of the external power supply voltage VDD as the transistor 323 is turned off by the logic high level control signal PVEB and the comparator 321 is disabled. The driving transistors 331 to 334 may be turned off by the driving control signal VEB having the level of the external power supply voltage VDD applied to the gates of the driving transistors 331 to 334. Accordingly, the voltage generation circuit 110 does not generate the internal power supply voltage VINTA.

The decoupling capacitor 340 may include decoupling capacitors 341, 342, 343, and 344 connected in parallel with each other. The decoupling capacitors 341, 342, 343, and 344 may be implemented using MOS transistors. For example, gates of the MOS transistors may all be connected to the internal power supply voltage VINTA line, and sources/drains of the MOS transistors may be connected to the ground voltage VSS lines. The decoupling capacitor 340 may reduce the noise such as voltage fluctuation of the internal power supply voltage VINTA line.

Figure 4:
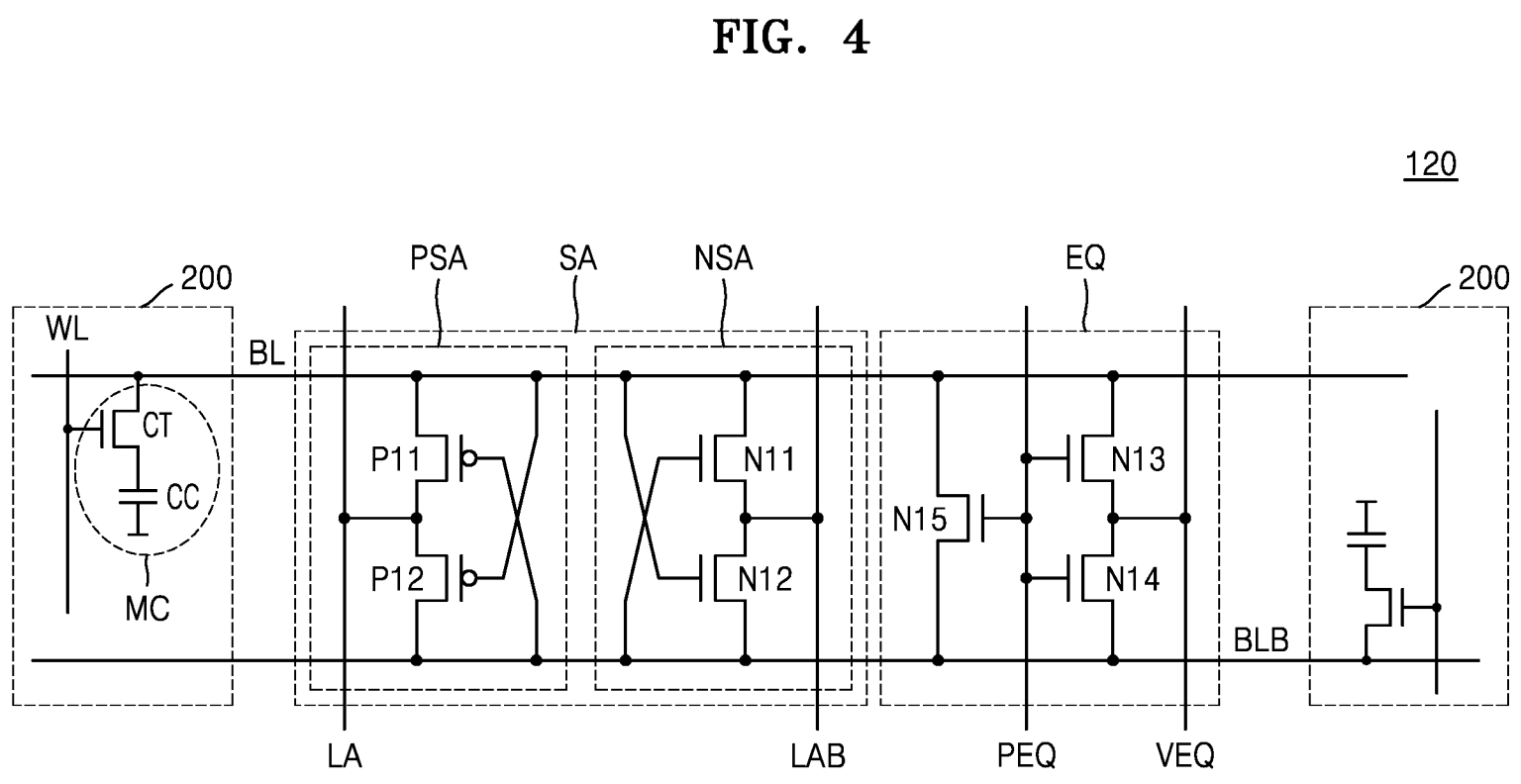

FIGS. 4 and 5 are diagrams of the sense amplifiers 120 according to embodiments of the disclosure. FIG. 5 is a diagram of a circuit for controlling the current levels of a first sensing driving voltage line LA and a second sensing driving voltage line LAB of a bitline sense amplifier circuit SA of FIG. 4 to be constantly supplied.

Referring to FIG. 4, the sense amplifiers 120 may include the bitline sense amplifier circuit SA and the precharge and equalization circuit EQ. The bitline sense amplifier circuit SA may include a P-type sense amplifier PSA including PMOS transistors and an N-type sense amplifier NSA including NMOS transistors.

The P-type sense amplifier PSA includes a first PMOS transistor P11 and a second PMOS transistor P12 connected in series between the bitline BL and the complementary bitline BLB. The first sensing driving voltage line LA is connected to sources of the first and second PMOS transistors P11 and P12, wherein the gate of the first PMOS transistor P11 is connected to the complementary bitline BLB and the gate of the second PMOS transistor P12 is connected to the bitline BL. The size of the first PMOS transistor P11 may be the same as or different from that of the second PMOS transistor P12 depending on embodiments.

The first sensing driving voltage line LA, connected to the first sensing control circuit 530 in FIG. 5, supplies the first sensing driving voltage to the bitline sense amplifier circuit SA under the control of the first sensing control circuit 530. The first sensing driving voltage of the bitline sense amplifier circuit SA, which is the internal power supply voltage VINTA supplied to be used in the operation of the memory cell array 200 in FIG. 1, may be the voltage generated from the voltage generation circuit 110 inside the memory device 10. The P-type sense amplifier PSA connected to the first sensing driving voltage line LA supplies a high level of the amplified voltage level during sensing and amplifying operations of data of a memory cell connected to the bitline BL.

The N-type sense amplifier NSA includes a first NMOS transistor N11 and a second NMOS transistor N12 connected in series between the bitline BL and the complementary bitline BLB. The second sensing driving voltage line LAB is connected to the sources of the first and second NMOS transistors N11 and N12, wherein the complementary bitline BLB is connected to the gate of the first NMOS transistor N11 and the bitline BL is connected to the gate of the second NMOS transistor N12. The size of the first NMOS transistor N11 may be the same as or different from that of the second NMOS transistor N12 depending on embodiments.

The second sensing driving voltage line LAB, connected to the second sensing control circuit 540 in FIG. 5, supplies the second sensing driving voltage to the bitline sense amplifier circuit SA under the control of the second sensing control circuit 540. The second sensing driving voltage of the bitline sense amplifier circuit SA may be the ground voltage VSS of the memory device 10. The N-type sense amplifier NSA connected to the second sensing driving voltage line LAB supplies a low level of the amplified voltage level during sensing and amplifying operations of data of a memory cell connected to the bitline BL.

The precharge and equalization circuit EQ equalizes the bitline BL and the complementary bitline BLB to the level of the bitline precharge voltage VEQ in response to an equalizing signal PEQ. The precharge and equalization circuit EQ includes a third NMOS transistor N13 connected between the bitline precharge voltage VEQ and the bitline BL, a fourth NMOS transistor N14 connected between the bitline precharge voltage VEQ and the complementary bitline BLB, and a fifth NMOS transistor N15 connected between the bitline BL and the complementary bitline BLB. According to some embodiment, the precharge and equalization circuit EQ may include either one of a third NMOS transistor N13 or a fourth NMOS transistor N14 or a fifth NMOS transistor N15.

Gates of the third to fifth NMOS transistors N13 to N15 are connected to the equalizing signal PEQ. The equalizing signal PEQ may be provided from the control logic circuit based on a command provided to the memory device 10. The equalizing signal PEQ is applied at a logic high level during the precharging operation of the bitline sense amplifier circuit SA to turn on the first to third NMOS transistors N13 to N15 and precharge the bitline BL and the complementary bitline BLB to the level of the bitline precharge voltage VEQ. During the sensing operation, the equalizing signal PEQ is applied at a logic low level to turn off the first to third NMOS transistors N13 to N15.

Referring to FIG. 5, the first and second sensing control circuits 530 and 540 may be commonly connected to bitline sense amplifier circuits SA. The first and second sensing control circuits 530 and 540 may control the current levels of the first sensing driving voltage line LA and the second sensing driving voltage line LAB of the bitline sense amplifier circuits SA to be constant.

FIG. 6 is a diagram of the row decoder 130 according to embodiments of the disclosure. The row decoder 130 of FIG. 6 may decode a row address to select a wordline corresponding to the row address and apply a wordline driving voltage of the high voltage VPP to the selected wordline.

Referring to FIGS. 1 and 6, the row decoder 130 may include wordline drivers connected to each of the memory blocks BLK1 to BLKi of FIG. 2, wherein each of the wordline drivers may include a sub-wordline signal generation circuit 610, a sub-wordline driving signal generation circuit 620 and a main wordline driving signal generation circuit 630. The configuration of the row decoder 130 shown in FIG. 6 does not represent or suggest a limitation to this disclosure.

The sub-wordline signal generation circuit 610, driven by a high voltage VPP and a ground voltage VSS, may include a NAND gate 611 and an inverter 612. The NAND gate 611 may receive the active signal ACTIVE and the first decoded row address signals DRA<0:2> and provide outputs thereof to the inverter 612. According to the output of the inverter 612, sub-wordline signals PXI<0:7> corresponding to the first decoded row address signals DRA<0:2> may be activated.

The active signal ACTIVE which is a control signal indicating that a selected memory block among the memory blocks BLK1 to BLKi is in an active mode may be provided based on an active command from a control logic circuit of the memory device 10. The active signal ACTIVE may be provided at a logic high level when the memory block is in an active mode, and may be provided at a logic low level when the memory block is in a standby mode. The first decoded row address signals DRA<0:2> are signals obtained by decoding row address signals of the lower 3 bits of the row address of the memory device 10. Since the first decoded row address signals DRA<0:2> may have eight cases (i.e., 000, 001, 010, 011, 100, 101, 110, and 111), the activated sub-wordline signals (PXI<0:7>) may also have eight cases. That is, according to the first decoded row address signals DRA<0:2>, one of the sub-wordline signals PXI<0>, PXI<1>, PXI<2>, PXI<3>, PXI<4>, and PXI<5>, PXI<6>, PXI<7> and PXI<8> may be activated. According to some embodiments, the sub-wordline signal generation circuit 610 using signals obtained by decoding the row address signals of the lower 2 bits of the row address of the memory device 10 may activate the sub-wordline signals PXI<0:3> corresponding to the first decoded row address signals of four cases (i.e., 00, 01, 10 and 11).

The sub-wordline driving signal generation circuit 620, driven by the high voltage VPP and the ground voltage VSS, may include a first inverter 622 and a second inverter 624. The sub-wordline driving signal generation circuit 620 may receive the sub-wordline signals PXI<0:7>, output from the first inverter 622 as inverted sub-wordline driving signals PXIB<0:7>, and output from the second inverter 624 as sub-wordline driving signals PXID<0:7>.

The main wordline driving signal generation circuit 630 may receive the active signal ACTIVE and the second decoded row address signal DRA<3:m>, where m is an integer greater than or equal to 4. In the active mode, the main wordline driving signal generation circuit 630 may activate the main wordline driving signal to a logic low level of the ground voltage VSS in response to the second decoded row address signal DRA<3:m>, wherein the main wordline driving signal corresponds to the second decoded row address signal DRA<3:m> among the main wordline driving signals MWL<0:n>.

The main wordline driving signal generation circuit 630 may include first and second PMOS transistors 631 and 632 connected in parallel between the high voltage VPP line and the first node NA line, first and second NMOS transistors 633 and 634 connected in series between the first node NA line and the ground voltage VSS line, a first inverter 635 having an input connected to the first node NA line and providing an output thereof to a second node NB line, and a second inverter 636 having an input connected to the second node NB line and an output connected to the main wordline driving signal MWL<0:n> line. The first and second inverters 635 and 636 may be driven by the high voltage VPP and the ground voltage VSS.

The first PMOS transistor 631 and the second NMOS transistor 634 may operate in response to the active signal ACTIVE, and the first NMOS transistor 633 may operate in response to the second decoded row address signal DRA<3:m>. The second PMOS transistor 632 may operate in response to a signal of the second node NB line.

For a memory block in an active mode among the memory blocks BLK1 to BLKi, according to the active signal ACTIVE at the logic high level and the second decoded row address signal DRA<3:m>, the first node NA line may be at the ground voltage VSS level, the second node NB line may be at the high voltage VPP level, and the main wordline driving signal corresponding to the second decoded row address signal DRA<3:m> may be at the ground voltage VSS level.

For a memory block in a standby mode among the memory blocks BLK1 to BLKi, according to the active signal ACTIVE at the logic low level, the first node NA line may be at the high voltage VPP level, the second node NB line may be at the ground voltage VSS level, and main wordline driving signal MWL<0:n> may be at a high voltage VPP level.

The row decoder 130 may drive, with a high voltage VPP, the wordline selected in response to the main wordline driving signal MWL<0:n> corresponding to the second decoded row address signal DRA<3:m> provided from the main wordline driving signal generation circuit 630 and the sub-wordline driving signals PXID<0:7> provided from the sub-wordline driving signal generation circuit 620.

Figure 7:
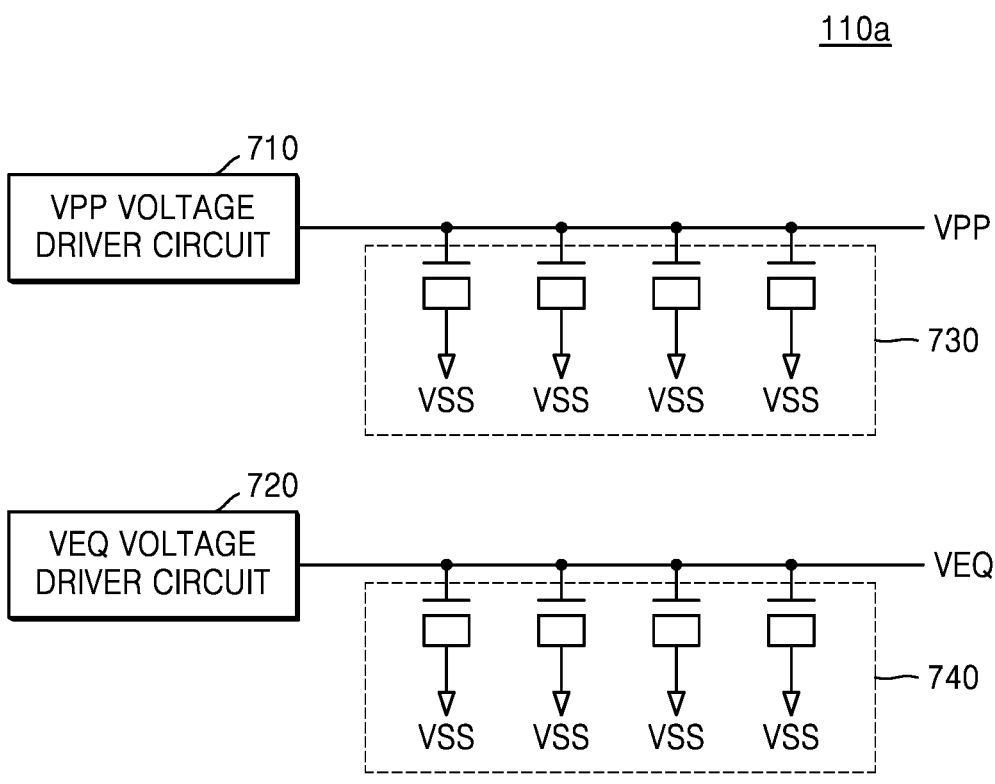
FIG. 7 is a diagram of a voltage generation circuit according to embodiments of the disclosure.

FIG. 7 is a diagram of a voltage generation circuit according to embodiments of the disclosure. Hereinafter, a suffix attached to a reference number (e.g., a in 110*a*) is for distinguishing a plurality of circuits having the same function.

Referring to FIGS. 1 and 7, the voltage generation circuit 110*a* may include a high voltage driver circuit 710, a bitline precharge voltage driver circuit 720, a first decoupling capacitor 730, and a second decoupling capacitor 740. The high voltage driver circuit 710 may generate the high voltage VPP driving the selected wordline WL in the memory cell array 200 for provision thereof to the row decoder 130. The bitline precharge voltage driver circuit 720 may generate the bitline precharge voltage VEQ used to equalize the bitline BL and the complementary bitline BLB before the sense amplifiers 120 sense the voltage difference between the bitline BL and the complementary bitline BLB for provision thereof to the precharge and equalization circuit EQ in FIG. 4.

The first decoupling capacitor 730 may reduce the noise of the high voltage VPP line. The second decoupling capacitor 740 may reduce the noise of the bitline precharge voltage VEQ line. The first decoupling capacitor 730 and the second decoupling capacitor 740 may be implemented using MOS transistors like the decoupling capacitor 340 described in FIG. 3.

Figure 8:
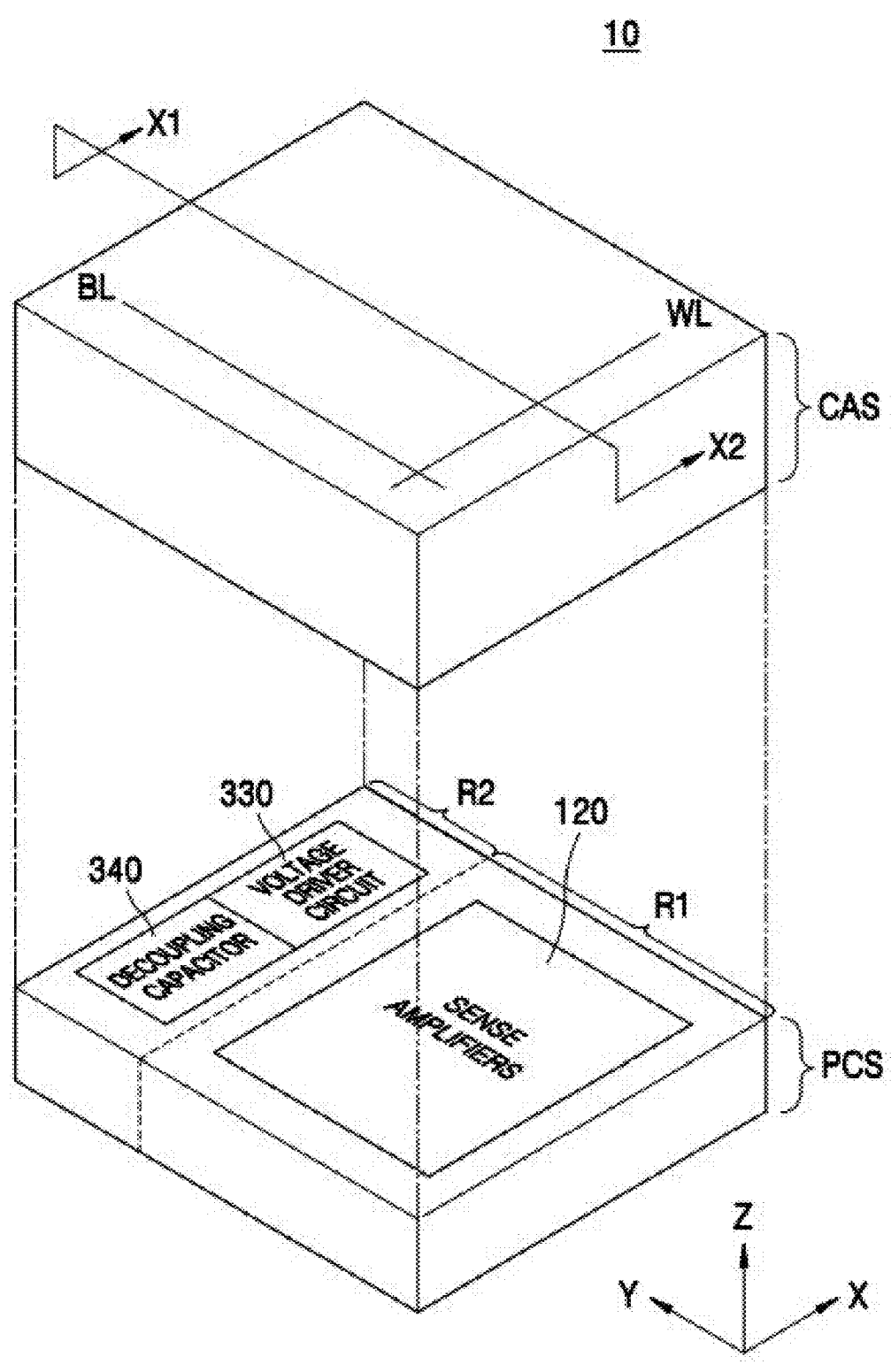
FIGS. 8 and 9 are diagrams of the structure of a memory device according to embodiments of the disclosure.
Figure 9:
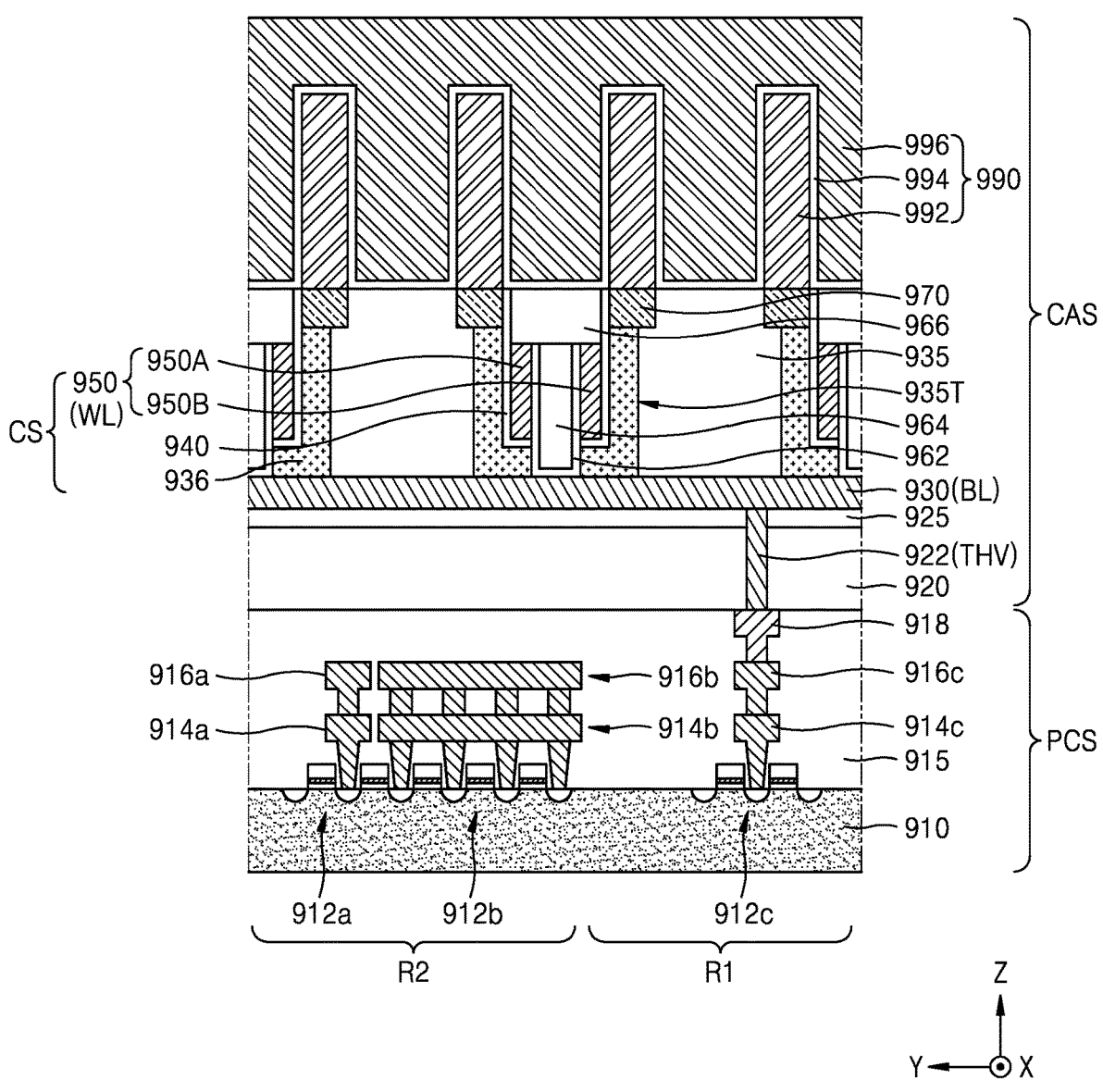

FIGS. 8 and 9 are diagrams of the structure of a memory device according to embodiments of the disclosure. FIG. 9 is a cross-sectional view taken along the X1-X2 line of FIG. 8.

Referring to FIGS. 1, 3, 7, and 8, the memory device 10 may include a cell array structure CAS and a peripheral circuit structure PCS overlapping each other in a vertical direction (Z direction). The cell array structure CAS may include the memory cell array 200. The peripheral circuit structure PCS may include the peripheral circuit 100. Accordingly, the memory device 10 may have a structure in which the memory cell array 200 is disposed on top of a peripheral circuit, that is, a cell over periphery (COP) structure.

The cell array structure CAS may include memory blocks BLK1, BLK2, . . . , BLKi. Each of the memory blocks BLK1, BLK2, . . . , BLKi may include memory cells including vertical channel transistors. In the cell array structure CAS, the bitlines BL may extend in a first horizontal direction (X direction), and the wordlines WL may extend in a second horizontal direction (Y direction).

The peripheral circuit structure PCS may include a semiconductor substrate, and the peripheral circuit 100 may be formed by forming semiconductor elements such as transistors and patterns for wiring the elements on the semiconductor substrate. After the peripheral circuit 100 is formed in the peripheral circuit structure PCS, the cell array structure CAS including the memory cell array 200 may be formed, and patterns may be formed to electrically connect the wordlines WL and bitlines BL of the memory cell array 200 with the peripheral circuit 100 formed in the peripheral circuit structure PCS. The peripheral circuit structure PCS may include a first region R1 corresponding to the sense amplifiers 120 and a second region R2 corresponding to the voltage driver circuit 330 and the decoupling capacitor 340 related to the internal power supply voltage VINTA. In some embodiments, the voltage driver circuits 710 and 720 and the decoupling capacitors 730 and 740 related to the high voltage VPP or the bitline precharge voltage VEQ may be positioned in the second region R2.

Referring to FIG. 9, the peripheral circuit structure PCS may include a lower substrate 910, an interlayer insulating layer 915, circuit elements 912*a*, 912*b*, and 912*c* formed on the lower substrate 910, first metal layers 914*a*, 914*b*, and 914*c* connected to the circuit elements 912*a*, 912*b*, and 912*c* respectively, second metal layers 916*a*, 916*b*, and 916*c* formed on the first metal layers 914*a*, 914*b*, and 914*c*, and a metal pattern 918 formed on the uppermost metal layer of the peripheral circuit structure PCS. In some embodiments, the first metal layers 914*a*, 914*b*, and 914*c* may be formed of tungsten having relatively high resistance, and the second metal layers 916*a*, 916*b*, and 916*c* may be formed of copper having relatively low resistance.

This description shows and describes only the first metal layers 914*a*, 914*b*, and 914*c* and the second metal layers 916*a*, 916*b*, and 916*c*, but is not limited thereto, and at least one or more metal layers may be further formed on the second metal layers 916*a*, 916*b*, and 916*c*. At least some of the one or more metal layers formed on the second metal layers 916*a*, 916*b*, and 916*c* may be formed of aluminum having lower resistance than copper of which the second metal layers 916*a*, 916*b*, and 916*c* are formed. The inter-layer insulating layer 915, disposed on the lower substrate 910 to cover or overlap the circuit elements 912*a*, 912*b*, and 912*c*, the first metal layers 914*a*, 914*b*, 914*c*, and the second metal layers 916*a*, 916*b*, 916*c*, may include an insulating material such as silicon oxide, silicon nitride and/or the like.

The circuit elements 912*a*, 912*b*, and 912*c* may be connected to at least one of the circuit elements included in the peripheral circuit 100. For better explanation, the first circuit element 912*a* may represent one of the transistors 331, 332, 333, and 334 of the voltage driver circuit 330 described in FIG. 3, and the second circuit element 912*b* may represent the decoupling capacitor 340. The third circuit element 912*c* may be one of the transistors P11 and N11 connected to the bitline BL in the sense amplifier 120 described in FIG. 5.

The cell array structure CAS may include an upper substrate 920, an inter-line insulating layer 925, a conductive line 930 on the inter-line insulating layer 925, a through electrode 922 under the conductive line 930, a cell structure CS on the conductive line 930, and capacitor structures 990 on the cell structure CS. The inter-line insulating layer 925 may be formed to surround lower and side surfaces of each of the conductive lines 930 in plan view and fill a space between the conductive lines 930. The conductive lines 930 may each extend in the first horizontal direction (X direction). The conductive lines 930 may be spaced apart along a second horizontal direction (Y direction) orthogonal to the first horizontal direction (X direction), and may extend in the first horizontal direction (X direction). The through electrode 922 may extend, penetrating the upper substrate 920, in the vertical direction (Z direction) to the metal pattern 918 of the peripheral circuit structure PCS, and may electrically connect the conductive lines 930 with the circuit element 912*c* of the sense amplifier 120. The conductive lines 930 may function as bitlines BL of the memory device 10.

A separation insulating layer 935 may be formed on the conductive line 930. The separation insulating layer 935 may include a channel trench 935T extending in the first horizontal direction (X direction), and may form insulating patterns spaced apart from each other by the channel trench 935T. A channel layer 936 may be formed in the channel trench 935T. The channel layer 936 may extend along the side and bottom surfaces of the channel trench 935T and be electrically connected to the conductive line 930. A gate dielectric layer 940 may be formed on the channel layer 936 in the channel trench 935T. The gate dielectric layer 940 may be positioned between the channel layer 936 and the gate electrode 950. The gate electrode 950 may be formed on the gate dielectric layer 940 in the channel trench 935T. In some embodiments, the gate electrode 950 may include a first gate electrode 950A and a second gate electrode 950B facing each other within one channel trench 935T. In this case, a structure of two transistors per one channel layer 936 may be implemented. The first gate electrode 950A may function as a first wordline of the memory cell array 200, and the second gate electrode 950B may function as a second wordline of the memory cell array 200.

In some embodiments, a barrier insulating layer 962 and a gap-fill insulating layer 964 may be formed between the first gate electrode 950A and the second gate electrode 950B. The first gate electrode 950A may be separated from the second gate electrode 950B by the barrier insulating layer 962 and the gap-fill insulating layer 964. The gap-fill insulating layer 964 may be formed on the barrier insulating layer 962 to fill a region between the first gate electrode 950A and the second gate electrode 950B.

The cell structure CS may include vertical channel transistor structures. The vertical channel transistor may refer to a structure in which a channel length of the channel layer 936 extends in a vertical direction (Z direction) perpendicular to the upper surface of the upper substrate 920. The vertical channel transistor may include the channel layer 936, the gate electrode 950, and the gate dielectric layer 940 positioned between the channel layer 936 and the first gate electrode 950A. The channel layer 936 of the vertical channel transistor may include a first source/drain region and a second source/drain region arranged in a vertical direction (Z direction). For example, a lower portion of the channel layers 936 may function as a first source/drain region, and an upper portion of the channel layer 936 may function as a second source/drain region. A portion of the channel layer 936 between the first source/drain region and the second source/drain region may function as a channel region.

A contact layer 970 may be formed in contact with a top surface of the channel layer 936. The contact layer 970 may connect the channel layer 936 and the capacitor structure 990. A top surface of the channel layer 936 adjacent to the first gate electrode 950A may be connected to one contact layer 970, and a top surface of the channel layer 936 adjacent to the second gate electrode 950B may be connected to another contact layer 970.

The capacitor structure 990 may be formed on the separation insulating layer 935 and the contact layer 970. The capacitor structure 990 may be in contact with the top surface of the contact layer 970. The capacitor structure 990 may store data controlled by the conductive line 930 and the gate electrode 950. The capacitor structure 990 may include a lower electrode 992, a capacitor dielectric layer 994, and an upper electrode 996. The capacitor structure 990 may store charges in the capacitor dielectric layer 994 using a potential difference generated between the lower electrode 992 and the upper electrode 996.

One of the vertical channel transistor structures and one of the capacitor structures 990 may be included in a memory cell, and thus the cell array structure CAS may include the cell structures CS and the capacitor structures 990.

Figure 10:
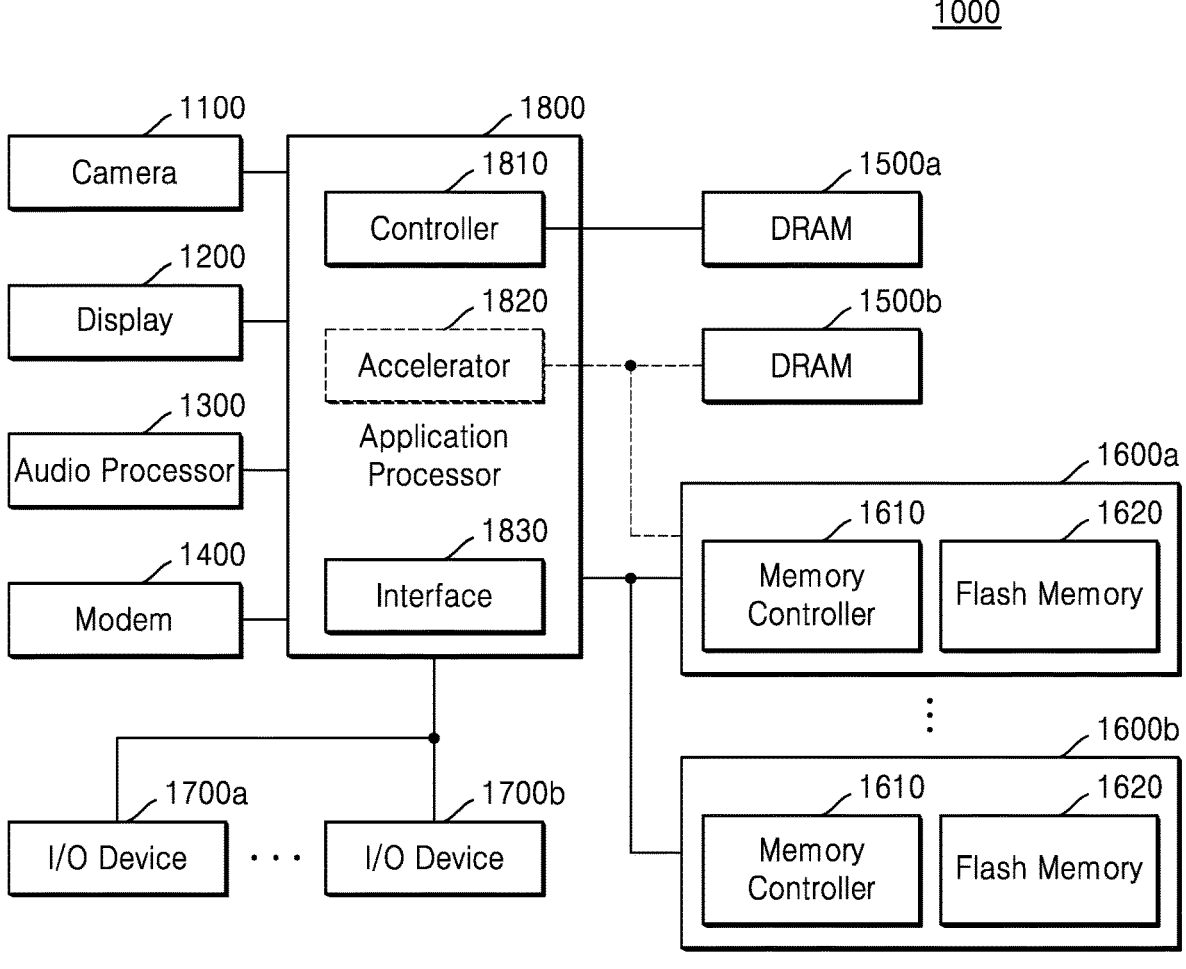
FIG. 10 is a block diagram of a system for describing an electronic device including a memory device according to embodiments of the disclosure.

FIG. 10 is a block diagram of a system 1000 for describing an electronic device including a memory device according to embodiments of the disclosure.

Referring to FIG. 10, the system 1000 may include a camera 1100, a display 1200, an audio processor 1300, a modem 1400, DRAMs 1500a and 1500b, flash memories 1600a and 1600b, I/O devices 1700a and 1700b and an application processor (hereinafter referred to as AP) 1800. The system 1000 may be implemented as a laptop computer, a mobile phone, a smart phone, a tablet personal computer, a wearable device, a healthcare device, or an internet of things (IoT) device. The system 1000 may also be implemented as a server or a personal computer.

The camera 1100 may capture still images or moving images under user control, and may store or transmit the captured image/video data to the display 1200. The audio processor 1300 may process audio data included in the flash memory devices 1600a and 1600b or network content. The modem 1400 may modulate and transmit a signal for transmission/reception of wired/wireless data, and the receiving side may demodulate the signal to be restored. The I/O devices 1700a and 1700b may include devices that provide digital input and/or output capabilities, such as universal serial buses (USB) or storages, digital cameras, secure digital (SD) cards, digital versatile discs (DVD), network adapters, touch screens, etc.

The AP 1800 may control overall operations of the system 1000. The AP 1800 may include a controller or control block 1810, an accelerator block or accelerator chip 1820 (e.g., an accelerator block that is a dedicated circuit for data operation or an accelerator chip apart from the AP 1800), and an interface block 1830. The AP 1800 may control the display 1200 to display some of the content stored in the flash memory devices 1600a and 1600b on the display 1200. When a user input is received through the I/O devices 1700a and 1700b, the AP 1800 may perform a control operation corresponding to the user input. The AP 1800 may include an accelerator block, which is a dedicated circuit for artificial intelligence (AI) data calculation, or may include an accelerator chip 1820 separately from the AP 1800. The DRAM 1500b may be additionally mounted on the accelerator block or the accelerator chip 1820. The accelerator which is a functional block that specializes in performing specific functions of the AP (1800) may include a GPU which is a functional block specialized in processing graphics data, a neural processing unit (NPU) which is a block for professionally performing AI calculation and inference, and a data processing unit (DPU) which is a block specialized in data transmission.

The system 1000 may include DRAMs 1500a and 1500b. The AP 1800 may control the DRAMs 1500a and 1500b through command and mode register (MRS) settings that conform to the Joint Electron Device Engineering Council (JEDEC) standard, or may communicate by setting DRAM interface rules in order to use company-specific functions such as low voltage/high speed/reliability and cyclic redundancy check (CRC)/error correction code (ECC) functions. For example, the AP 1800 may communicate with the DRAM 1500a through an interface conforming to JEDEC standards such as LPDDR4 and LPDDR5, and the accelerator block or accelerator chip 1820 may communicate by setting a new DRAM interface protocol in order to control the accelerator DRAM 1500b that is associated with Accelerator 1820 having a higher bandwidth than the DRAM 1500a.

FIG. 10 shows only DRAMS 1500a and 1500b, but is not limited thereto, and any memory, such as PRAM, SRAM, MRAM, RRAM, FRAM, or Hybrid RAM, may be used as long as the bandwidth, response speed, and voltage conditions of the AP 1800 or the accelerator chip 1820 are satisfied. The DRAMs 1500*a* and 1500*b* have relatively smaller latency and bandwidth than the I/O devices 1700*a* and 1700*b* or the flash memories 1600*a* and 1600*b*. The DRAMs 1500*a* and 1500*b* may be initialized when the system 1000 is powered on, and may be used as temporary storage for the operating system and the application data as loaded with the operating system and the application data or used as execution spaces for various software codes.

In the DRAMs 1500*a* and 1500*b*, four arithmetic operations including addition, subtraction, multiplication, and division, vector operations, address operations, or FFT (Fast Fourier Transform) operations may be performed. In addition, a function for execution used for inference may be performed within the DRAMs 1500*a* and 1500*b*, wherein the inference may be performed in a deep learning algorithm using an artificial neural network. The deep learning algorithm may include a training operation for learning a model through various data and an inference operation for recognizing data with the learned model. As an example embodiment, the image captured by the user through the camera 1100 is signal-processed and stored in the DRAM 1500*b*, and the accelerator block or accelerator chip 1820 may perform an AI data operation for recognizing data using data stored in the DRAM 1500*b* and/or a function used for inference.

The system 1000 may include storages or flash memories 1600*a* and 1600*b* having a larger capacity than the DRAMs 1500*a* and 1500*b*. The accelerator block or accelerator chip 1820 may perform the training operation and/or the AI data operation using the flash memories 1600*a* and 1600*b*. In some embodiments, the flash memories 1600*a* and 1600*b* may include a memory controller 1610 and a flash memory device 1620, and may more efficiently perform the training operation and the AI data operation performed by the AP 1800 and/or the accelerator chip 1820 using an arithmetic unit included in the memory controller 1610. The flash memories 1600*a* and 1600*b* may store pictures taken through the camera 1100 or data transmitted through a data network. For example, augmented reality/virtual reality, high definition (HD), or ultra-high definition (UHD) content may be stored.

In the system 1000, the DRAMs 1500*a* and 1500*b* may include the memory device described with reference to FIGS. 1 to 9. The memory device may include a peripheral circuit structure mounted on a semiconductor substrate and a cell array structure vertically overlapping the peripheral circuit structure thereon. The cell array structure may include a memory cell region in which the vertical channel transistor structures and the capacitor structures connected thereto respectively are formed. The peripheral circuit structure may include a first region including sense amplifiers for sensing bitlines of a memory cell region and a second region disposed adjacent to the first region. The second region may include a voltage driver circuit for driving the internal power voltage VINTA, the bitline precharge voltage VEQ, or the high voltage VPP, and a decoupling capacitor connected to each line of the voltages. Performance of the memory device may be improved by reducing the effect of noise due to voltage fluctuation of the voltage line.

While the inventive concept has been particularly shown and described with reference to embodiments thereof, it will be understood that various changes in form and details may be made therein without departing from the spirit and scope of the following claims.

What is claimed is:

1. A memory device comprising:
a peripheral circuit structure; and
a cell array structure overlapping the peripheral circuit structure,
wherein the cell array structure includes a memory cell region including wordlines extending in a first horizontal direction and bitlines extending in a second horizontal direction that intersects the first horizontal direction,
wherein the memory cell region includes transistor structures on the bitlines, capacitor structures electrically connected to respective ones of the transistor structures, and
wherein the peripheral circuit structure includes a first region including sense amplifiers coupled to the bitlines of the memory cell region, and a second region adjacent to the first region and including a first voltage driver circuit configured to generate an internal power supply voltage to provide to the sense amplifiers,
wherein a first transistor of the transistor structures comprises a channel layer that extends in a vertical direction that intersects the first horizontal direction and the second horizontal direction and is in contact with a contact layer,
wherein a first one of the capacitor structures comprises a lower electrode that is in contact with the contact layer, and
wherein a width of the contact layer is greater than a width of an upper surface of the channel layer of the first transistor in the second horizontal direction.

2. The memory device of claim 1,
wherein the peripheral circuit structure further includes a decoupling capacitor in the second region, and
wherein a voltage line electrically connects the internal power supply voltage to the decoupling capacitor.

3. The memory device of claim 1,
wherein the peripheral circuit structure further includes a second voltage driver circuit in the second region and configured to provide a bitline precharge voltage to the sense amplifiers.

4. The memory device of claim 3,
wherein the peripheral circuit structure further includes a decoupling capacitor that is electrically connected to the first voltage driver circuit and configured to reduce voltage fluctuation of the internal power supply voltage.

5. The memory device of claim 3,
wherein the peripheral circuit structure further includes a third voltage driver circuit in the second region and configured to generate a high voltage that is provided to the wordlines of the memory cell region, and
wherein the high voltage is greater than the internal power supply voltage.

6. The memory device of claim 5,
wherein the peripheral circuit structure further includes a decoupling capacitor in the second region, and electrically connected to a voltage line that is configured to provide the high voltage.

7. The memory device of claim 5,
wherein the peripheral circuit structure further includes a voltage generation circuit in the second region and configured to generate the internal power supply voltage, the bitline precharge voltage, and the high voltage.

8. The memory device of claim 1,
wherein the peripheral circuit structure further includes a row decoder circuit configured to control the wordlines in the second region.

9. The memory device of claim 1,
wherein the peripheral circuit structure further includes a column decoder circuit configured to control the bitlines in the second region.

10. A memory device comprising:
a peripheral circuit structure; and
a cell array structure overlapping the peripheral circuit structure,
wherein the cell array structure includes a memory cell region including wordlines extending in a first horizontal direction and bitlines extending in a second horizontal direction that intersects the first horizontal direction,
wherein the memory cell region includes transistor structures on the bitlines, and capacitor structures electrically connected to respective ones of the transistor structures, and
wherein the peripheral circuit structure includes a first region including sense amplifiers coupled to the bitlines of the memory cell region, and a second region adjacent to the first region and including a first decoupling capacitor electrically connected to an internal power supply voltage line that is configured to provide an internal power supply voltage to the sense amplifiers,
wherein a first transistor of the transistor structures comprises a channel layer that extends in a vertical direction that intersects the first horizontal direction and the second horizontal direction and is in contact with a contact layer,
wherein a first one of the capacitor structures comprises a lower electrode that is in contact with the contact layer, and
wherein a width of the contact layer is greater than a width of an upper surface of the channel layer of the first transistor in the second horizontal direction.

11. The memory device of claim 10,
wherein the peripheral circuit structure further includes a first voltage driver circuit configured to generate the internal power supply voltage in the second region.

12. The memory device of claim 11,
wherein the peripheral circuit structure further includes a second voltage driver circuit in the second region and configured to provide a bitline precharge voltage to the sense amplifiers.

13. The memory device of claim 12,
wherein the peripheral circuit structure further includes a second decoupling capacitor in the second region and that is electrically connected to the first voltage driver circuit and configured to reduce voltage fluctuation of the internal power supply voltage.

14. The memory device of claim 12,
wherein the peripheral circuit structure further includes a third voltage driver circuit configured to generate a high voltage that is provided to the wordlines of the memory cell region in the second region, and wherein the high voltage is greater than the internal power supply voltage.

15. The memory device of claim 14,
wherein the peripheral circuit structure further includes a second decoupling capacitor electrically connected to a voltage line that is configured to provide the high voltage in the second region.

16. The memory device of claim 14,
wherein the peripheral circuit structure further includes a voltage generation circuit configured to generate the internal power supply voltage, the bitline precharge voltage, and the high voltage in the second region.

17. The memory device of claim 10,
wherein the peripheral circuit structure further includes a row decoder circuit configured to control the wordlines in the second region.

18. The memory device of claim 10,
wherein the peripheral circuit structure further includes a column decoder circuit configured to control the bitlines in the second region.

19. A memory device comprising:
a peripheral circuit structure; and
a cell array structure overlapping the peripheral circuit structure,
wherein the cell array structure includes a memory cell region including wordlines and bitlines,
wherein the memory cell region includes transistor structures on the bitlines, and capacitor structures electrically connected to respective ones of the transistor structures,
wherein the peripheral circuit structure includes a first region including sense amplifiers coupled to the bitlines of the memory cell region, and a second region adjacent to the first region and including a voltage generation circuit that is configured to generate an internal power supply voltage and a bitline precharge voltage that are provided to the sense amplifiers,
wherein a first transistor of the transistor structures comprises a channel layer that extends in a vertical direction and is in contact with a contact layer,
wherein a first one of the capacitor structures comprises a lower electrode that is in contact with the contact layer, and
wherein a width of the contact layer is greater than a width of an upper surface of the channel layer of the first transistor in a direction parallel to an extension direction of the bitlines.

20. The memory device of claim 19,
wherein the peripheral circuit structure further includes a first decoupling capacitor electrically connected to a first voltage line that is configured to provide the internal power supply voltage to the sense amplifiers and a second decoupling capacitor electrically connected to a second voltage line that is configured to provide the bitline precharge voltage to the sense amplifiers,
wherein the first decoupling capacitor and the second decoupling capacitor are in the second region of the memory device.

* * * * *